(12) United States Patent
Hu et al.

(10) Patent No.: US 8,531,021 B2
(45) Date of Patent: Sep. 10, 2013

(54) PACKAGE STACK DEVICE AND FABRICATION METHOD THEREOF

(75) Inventors: Chu-Chin Hu, Taoyuan (TW); Shih-Ping Hsu, Taoyuan (TW); Yi-Ju Chen, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 57 days.

(21) Appl. No.: 13/160,874

(22) Filed: Jun. 15, 2011

(65) Prior Publication Data

US 2012/0193789 A1 Aug. 2, 2012

(30) Foreign Application Priority Data

Jan. 27, 2011 (TW) .............................. 100103087 A

(51) Int. Cl.
*H01L 23/02* (2006.01)

(52) U.S. Cl.
USPC .................... 257/686; 257/777; 257/E25.006; 257/E25.013

(58) Field of Classification Search
USPC .......... 257/686, 738, 777, 780, 787, E25.006, 257/E25.013
See application file for complete search history.

(56) References Cited

U.S. PATENT DOCUMENTS

| 2006/0170089 A1* | 8/2006 | Mizukoshi | 257/686 |
| 2011/0140259 A1* | 6/2011 | Cho et al. | 257/686 |

\* cited by examiner

*Primary Examiner* — Hoai V Pham
(74) *Attorney, Agent, or Firm* — Edwards Wildman Palmer LLP; Peter F. Corless; Steven M. Jensen

(57) ABSTRACT

A package stack device includes a first package structure having a plurality of first metal posts and a first electronic element disposed on a surface thereof, a second package structure having a plurality of second metal posts and a second electronic element disposed on opposite surfaces thereof, and an encapsulant formed between the first and second package structures for encapsulating the first electronic element. By connecting the first and second metal posts, the second package structure is stacked on the first package structure with the support of the metal posts and the encapsulant filling the gap therebetween so as to prevent warpage of the substrate.

8 Claims, 4 Drawing Sheets

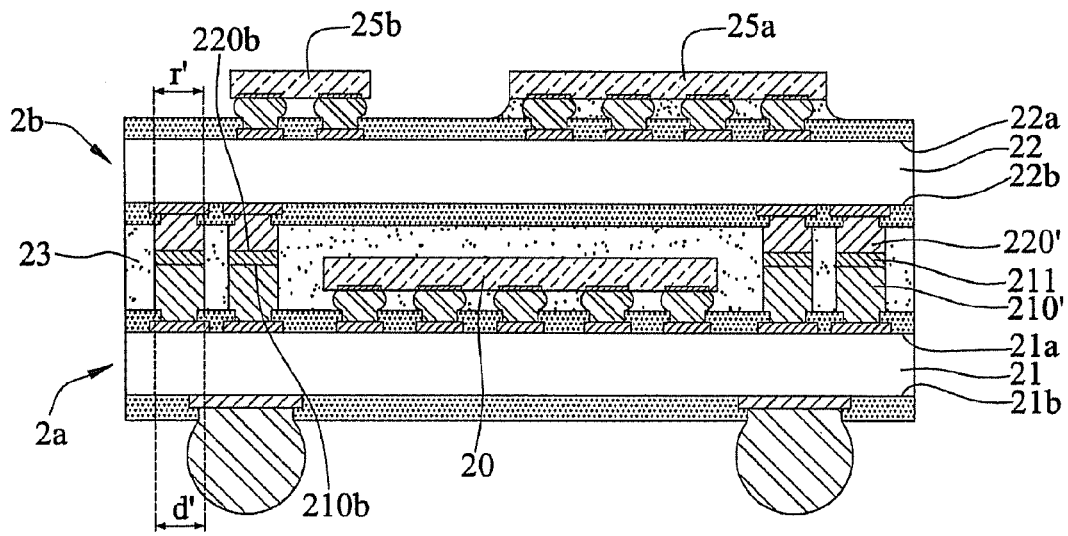
FIG.2G'
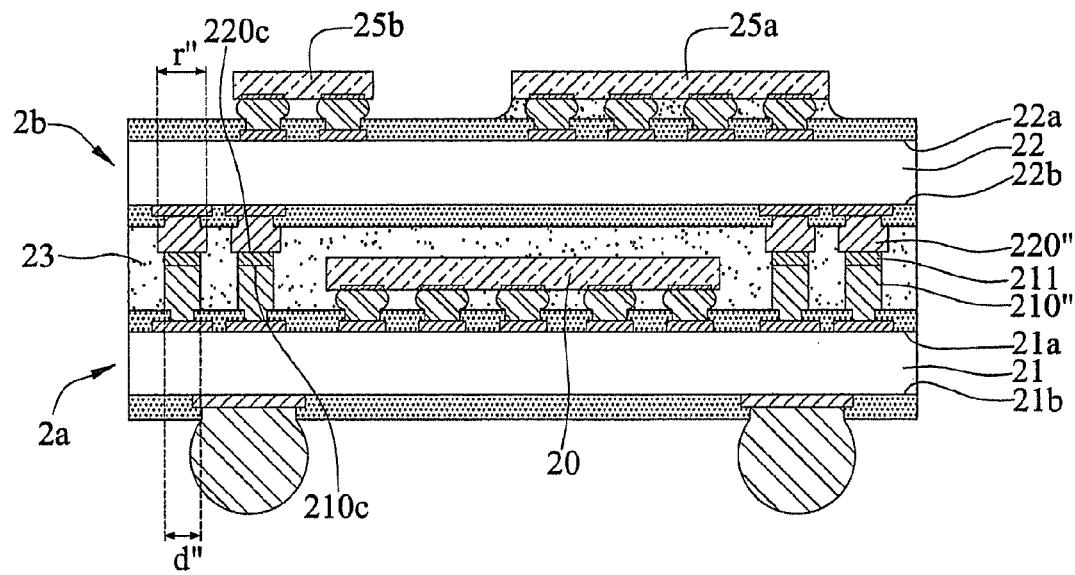
FIG.2G"

PACKAGE STACK DEVICE AND FABRICATION METHOD THEREOF

CROSS-REFERENCES TO RELATED APPLICATIONS

This application claims under 35 U.S.C. §119(a) the benefit of Taiwanese Application No. 100103087, filed Jan. 27, 2011, the entire contents of which is incorporated herein by reference.

BACKGROUND OF THE INVENTION

1. Field of the Invention

The present invention relates to package stack devices and fabrication methods thereof, and more particularly, to a package stack device having a plurality of package structures stacked on each other and a fabrication method thereof.

2. Description of Related Art

Along with the development of semiconductor packaging technology, various types of packages haven been developed for semiconductor devices. In order to further enhance electrical performance and reduce package size, a plurality of package structures are stacked on each other to form a POP (package on package) device. As such, electronic elements having difference functions, such as memories, CPUs (central processing units), GPUs (graphics processing units), image application processors and the like, can be integrated together so as to be applied in various kinds of thin-type electronic products. FIG. 1 schematically illustrates a cross-sectional view of a conventional package stack device.

Referring to FIG. 1, a second package structure 1b is stacked on a first package structure 1a. The first package structure 1a comprises a first substrate 11 having a first surface 11a and a second surface 11b opposite to the first surface 11a, and a first electronic element 10 disposed on the first surface 11a and electrically connected to the first substrate 11. The second package structure 1b comprises a second substrate 12 having a third surface 12a and a fourth surface 12b opposite to the third surface 12a, and a second electronic element 15 disposed on the third surface 12a and electrically connected to the second substrate 12. Further, a plurality of solder balls 110 are formed on the first surface 11a of the first substrate 11 so as for the fourth surface 12b of the second substrate 12 to be stacked thereon and electrically connected to the first substrate 11. Furthermore, a plurality of ball pads 112 are formed on the second surface 11b of the first substrate 11 for mounting solder balls 14. The first and second electronic elements 10, 15, which can be active components and/or passive components, are flip-chip electrically connected to the substrates 11, 12, respectively, and an underfill 13 is filled between the electronic elements 10, 15 and the substrates 11, 12 so as to bond the electronic elements 10, 15 with the substrates 11, 12, respectively.

However, since the second package structure 1b is stacked on the first package structure 1a through a soldering process, the solder material forming the solder balls 110 can easily contaminate surfaces of the first and second package structures 1a, 1b during reflow. Further, variation in the size of the solder balls 110 is not easy to control, which can easily adversely affect vertical stacking of the two package structures and even cause positional deviation of joints between the two package structures.

Furthermore, with the increase of stack height, the diameters of the solder balls 110 must be increased. Accordingly, the area of the surfaces (the first surface 11a and the fourth surface 12b) occupied by the solder balls 110 is increased. Consequently, the spaces available for the electronic elements and circuits are reduced.

Moreover, increased size of the solder balls 110 can easily cause bridging between the solder balls, thus adversely affecting the product yield.

In addition, since the second package structure 1b is supported by the solder balls 110 on the first package structure 1a and a big gap exists between the first and second package structures 1a, 1b, warpage can easily occur to the first and second substrates 11, 12.

Therefore, there is a need to provide a package stack device and a fabrication method thereof so as to overcome the above-described drawbacks.

SUMMARY OF THE INVENTION

Accordingly, the present invention provides a package stack device, which comprises: a first package structure, comprising: a first substrate having a first surface with a plurality of first metal posts and a second surface opposite to the first surface, and a first electronic element disposed on the first surface of the first substrate and electrically connected to the first substrate; a second package structure, comprising: a second substrate having a third surface and a fourth surface opposite to the third surface, the fourth surface having a plurality of second metal posts connected to the first metal posts, respectively, so as to allow the second package structure to be stacked on the first package structure, and a second electronic element disposed on the third surface of the second substrate and electrically connected to the second substrate; and an encapsulant disposed between the first surface of the first substrate and the fourth surface of the second substrate to encapsulate the first electronic element.

The present invention further provides a fabrication method of a package stack device, which comprises the steps of: providing a first substrate having a first surface with a plurality of first metal posts and a second surface opposite to the first surface; disposing a first electronic element on the first surface of the first substrate and electrically connecting the first electronic element and the first substrate so as to form a first package structure; providing a second substrate having a third surface and a fourth surface opposite to the third surface and having a plurality of second metal posts; disposing a second electronic element on the third surface of the second substrate and electrically connecting the second electronic element and the second substrate so as to form a second package structure; connecting the first and second metal posts so as to stack the second package structure on the first package structure; and forming an encapsulant between the first surface of the first substrate and the fourth surface of the second substrate for encapsulating the first electronic element.

In the above-described device and method, the first and second metal posts can be copper posts formed by electroplating, but the present invention is not limited thereto.

In the above-described device and method, end surfaces of the first metal posts can have a width greater than, equal to or less than the width of end surfaces of the second metal posts.

In the above-described device and method, a solder material can be formed on the first metal posts for bonding with the corresponding second metal posts.

In the above-described device and method, the second surface of the first substrate can have a plurality of ball pads for mounting solder balls.

In the above-described device and method, the first and second electronic elements can be active components and/or passive components.

Therefore, the present invention stacks and electrically connects two package structures through a plurality of metal posts so as to avoid contamination of surfaces of the package structures by a solder material as in the prior art. Further, variation in the size of the metal posts is easy to control, thereby facilitating vertical stacking of the package structures and overcoming the conventional problem of joint deviation.

Furthermore, variation in the heights of the metal posts does not change the diameters of the metal posts and accordingly the surface area occupied by the metal posts does not increase, thereby avoiding reduction of available spaces for circuits and electronic elements.

Furthermore, by forming the metal posts through electroplating, the present invention avoids the risk of bridging when the metal posts are increased in height, thus increasing the product yield.

Moreover, warpage of the substrates are prevented since the package structures are supported by the metal posts and the gap between the first and second package structures is filled with the encapsulant.

DETAILED DESCRIPTION OF PREFERRED EMBODIMENTS

The following illustrative embodiments are provided to illustrate the disclosure of the present invention, these and other advantages and effects can be apparent to those in the art after reading this specification.

FIGS. 2A to 2G are cross-sectional views showing a fabrication method of a package stack device according to the present invention.

Figure 1:
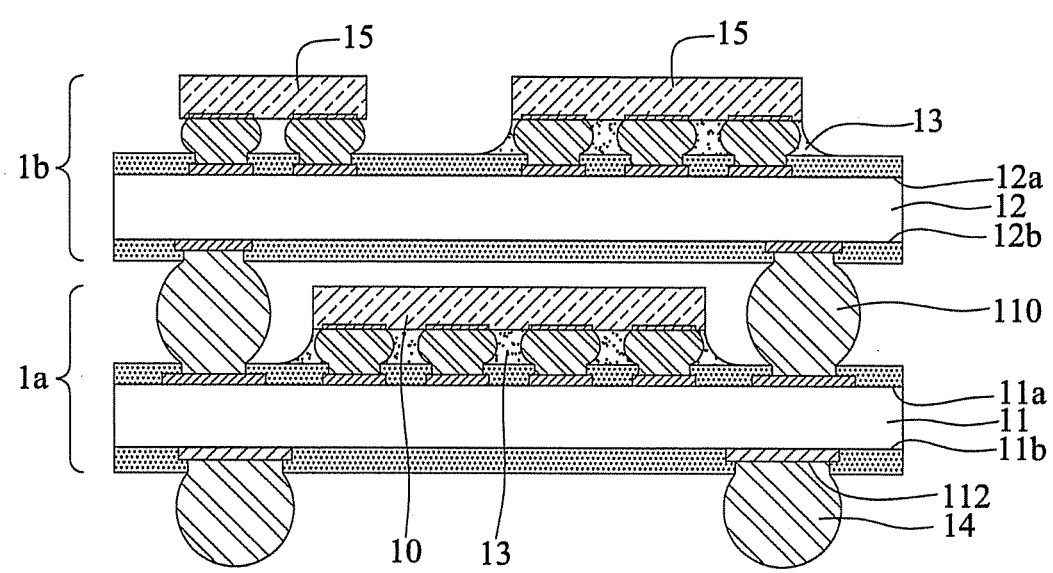
FIG. 1 is a cross-sectional view of a conventional package stack device.
Figure 2A:
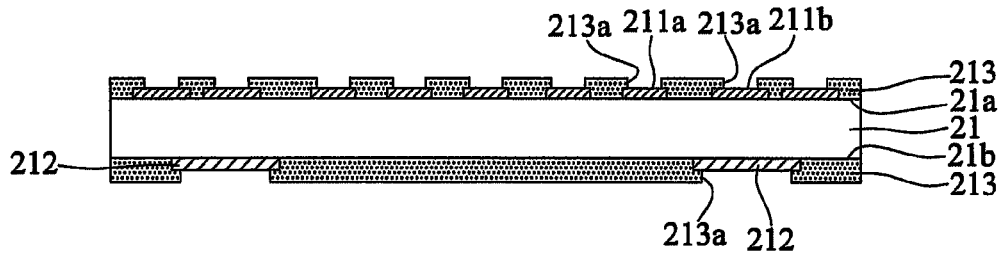
FIGS. 2A to 2G are cross-sectional views showing a fabrication method of a package stack device according to the present invention, wherein FIGS. 2G' and 2G" show other embodiments of FIG. 2G.

Referring to FIG. 2A, a first substrate 21 having a first surface 21a and a second surface 21b opposite to the first surface 21a is provided. The first surface 21a of the first substrate 21 has a plurality of solder pads 211a and a plurality of conductive pads 211b. The second surface 21b of the first substrate 21 has a plurality of ball pads 212.

In the present embodiment, an insulating protection layer 213 such as a solder mask layer is formed on the first and second surfaces 21a, 21b of the first substrate 21, and a plurality of openings 213a are formed in the insulating protection layer 213 for exposing the solder pads 211a, the conductive pads 211b and the ball pads 212, respectively.

Figure 2B:
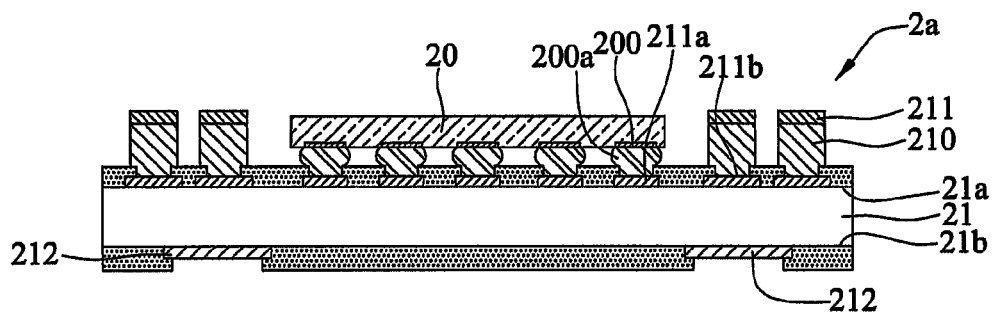

Referring to FIG. 2B, a plurality of first metal posts 210 are formed on the exposed surfaces of the conductive pads 211b by electroplating, and a first electronic element 20 is disposed on the exposed surfaces of the solder pads 211a through solder bumps 200a, i.e., electrode pads 200 of the first electronic element 20 are flip-chip electrically connected to the first substrate 21, thereby forming a first package structure 2a.

In the present embodiment, the first metal posts 210 are copper posts. Further, a solder material 211 can be formed on the copper posts so as to facilitate a subsequent stacking process. The first electronic element 20 can be an active component such as a chip and/or a passive component such as a resistor, a capacitor or an inductor.

Figure 2C:
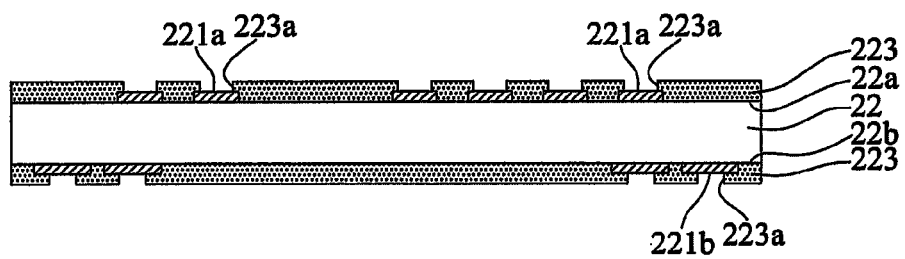

Referring to FIG. 2C, a second substrate 22 having a third surface 22a and a fourth surface 22b opposite to the third surface 22a is provided. The third surface 22a of the second substrate 22 has a plurality of solder pads 221a, and the fourth surface 22b of the second substrate 22 has a plurality of conductive pads 221b. Further, an insulating protection layer 223 such as a solder mask layer is formed on the third and fourth surfaces 22a, 22b of the second substrate 22, and a plurality of openings 223a are formed in the insulating protection layer 223 for exposing the solder pads 221a and the conductive pads 221b, respectively.

Figure 2D:
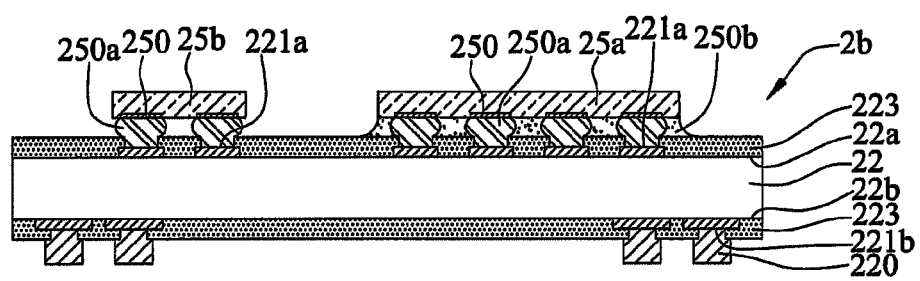

Referring to FIG. 2D, a plurality of second metal posts 220 such as copper posts are formed on the exposed surfaces of the conductive pads 221b of the second substrate 22 by electroplating, and a plurality of second electronic elements 25a, 25b are disposed on the exposed surfaces of the solder pads 221a of the second substrate 22 through solder bumps 250a, thereby forming a second package structure. Electrode pads 250 of the second electronic elements 25a, 25b are flip-chip electrically connected to the second substrate 22.

In the present embodiment, the second electronic element 25a is an active component such as a semiconductor chip, and an underfill 250b is filled between the second electronic element 25a and the third surface 22a of the second substrate 22. The second electronic element 25b is a passive component, such as a resistor, a capacitor or an inductor.

Figure 2E:
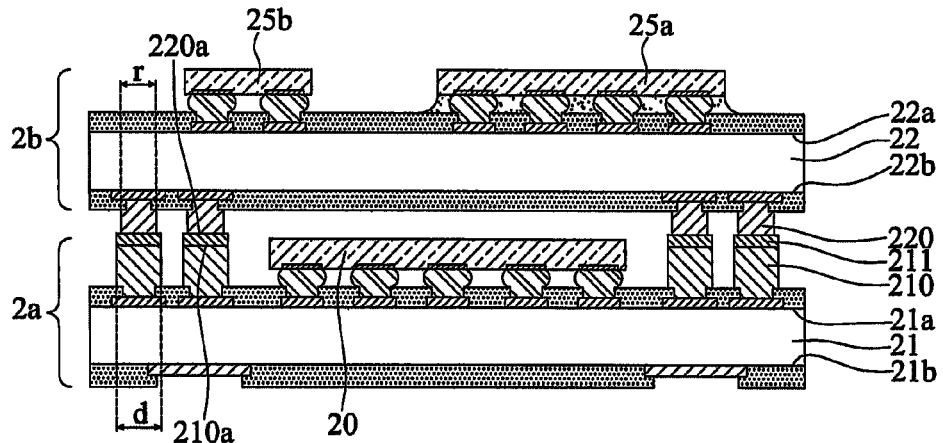

Referring to FIG. 2E, the second metal posts 220 are connected to the first metal posts 210 (or the solder material 211 on the metal posts 210) to thereby stack the second package structure 2b on the first package structure 2a.

In the present embodiment, the width d (or maximum diameter) of end surfaces 210a (bonding surfaces) of the first metal posts 210 is greater than the width r of end surfaces 220a of the second metal posts 220. Such a difference in width facilitates alignment of the first and second package structures so as to avoid the risk of joint deviation.

Further, increase in the heights of the first and second metal posts 210,220 does not increase the diameters of the first and second metal posts 210,220. Therefore, a thin-type semiconductor device can be achieved. Meanwhile, an increased number of the first and second metal posts 210, 220 can be provided in a predetermined region so as to facilitate the alignment of the first and second package structures 2a, 2b.

Figure 2F:
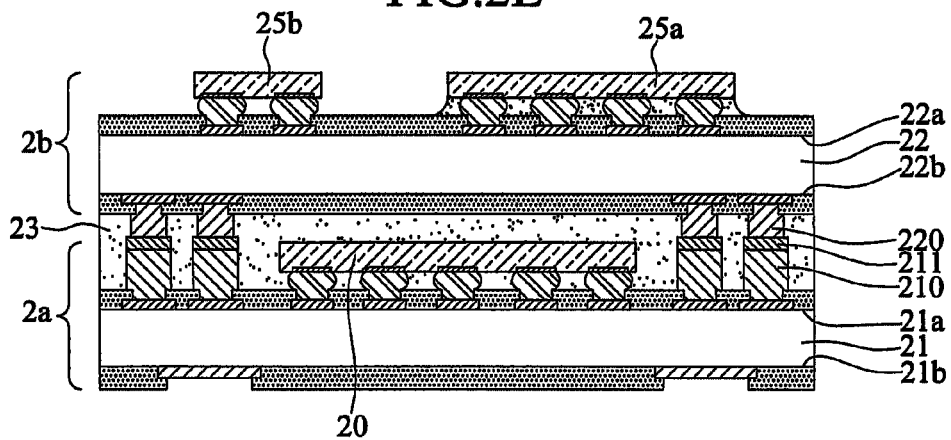

Referring to FIG. 2F, an encapsulant 23 is formed between the first surface 21a of the first substrate 21 and the fourth surface 22b of the second substrate 22 to encapsulate the first electronic element 20.

Figure 2G:
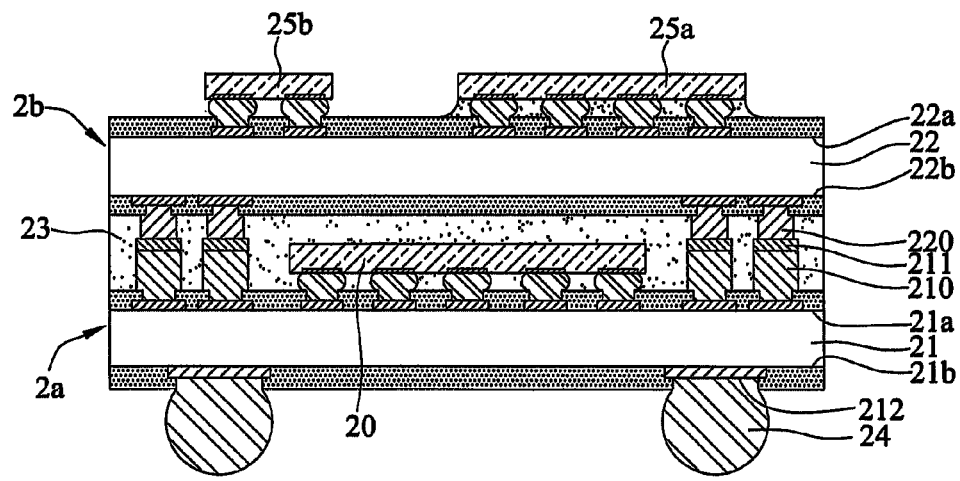

Referring to FIG. 2G, a plurality of solder balls 24 are mounted on the exposed surfaces of the ball pads 212 of the first substrate 21.

Referring to FIG. 2G', the width d' (such as diameter) of the end surfaces 210b of the first metal posts 210' is equal to the width r' (such as diameter) of the end surfaces 220b of the second metal posts 220'. Although the end surfaces 210b, 220b of the metal posts 210',220' have the same width, since variation in the size of the metal posts are easy to control, the use of the metal posts facilitates vertical stacking of the package structures and helps to reduce the risk of joint deviation as compared with the prior art.

Alternatively, referring to FIG. 2G", the width d" of the end surfaces 210c of the first metal posts 210" is less than the width r" of the end surfaces 220c of the second metal posts 220".

The present invention stacks and electrically connects the first and second package structures 2a, 2b by connecting the first and second metal posts 210,220 formed by electroplating. Compared with the conventional reflow process, the metal material forming the first and second metal posts 210, 220 does not contaminate surfaces of the first and second package structures 2a, 2b.

Further, variation in the heights of the first and second metal posts 210, 220 does not change the diameters of the first and second metal posts 210,220. Therefore, the area of the surfaces (the first surface 21a and the fourth surface 22b) occupied by the first and second metal posts 210,220 will not increase, thereby avoiding reduction of available spaces for circuits and electronic elements. On the other hand, the package stack device of the present invention has a greatly reduced volume compared with the prior art when the number of required circuits is the same.

Furthermore, since the first and second metal posts 210, 220 are formed by electroplating, it avoids the risk of bridging when the first and second metal posts 210,220 are increased in height, thereby increasing the product yield.

Moreover, warpage of the first and second substrates 21, 22 are prevented since the second package structure 2b is supported on the first package structure 2a by the first and second metal posts 210, 220 and the encapsulant 23 formed by such as molding fills the gap between the first and second substrates 21, 22.

The present invention further provides a package stack device, which comprises: a first package structure 2a, a second package structure 2b stacked on the first package structure 2a, and an encapsulant 23 disposed between the first and second package structures 2a, 2b.

The first package structure 2a comprises a first substrate 21 having a first surface 21a and a second surface 21b opposite to the first surface 21a, and a first electronic element 20 disposed on the first surface 21a and electrically connected to the first substrate 21. The first surface 21a of the first substrate 21 has a plurality of first metal posts 210, and the second surface 21b of the first substrate 21 has a plurality of ball pads 212 for mounting solder balls 24. The first metal posts 210 are copper posts formed by electroplating. The first electronic element 20 is an active component and/or a passive component.

The second package structure 2b comprises a second substrate 22 having a third surface 22a and a fourth surface 22b opposite to the third surface 22a, and second electronic elements 25a, 25b disposed on the third surface 22a and electrically connected to the second substrate 22. The fourth surface 22b of the second substrate 22 has a plurality of second metal posts 220 which are connected to the first metal posts 210 so as to allow the second package structure 2b to be stacked on the first package structure 2a. The second metal posts 220 are copper posts formed by electroplating. The second electronic element 220 is an active component and/or a passive component.

The encapsulant 23 is disposed between the first surface 21a of the first substrate 21 and the fourth surface 22b of the second substrate 22 to encapsulate the first electronic elements 20.

Further, a solder material 211 is filled between the first metal posts 210 and the second metal posts 220.

Furthermore, the width d, d', d" of the end surfaces 210a, 210b, 210c of the first metal posts 210, 210',210" is greater than, equal to or less than the width r, r', r" of the end surfaces 220a, 220b, 220c of the second metal posts 220, 220', 220".

Therefore, the present invention stacks and electrically connects two package structures through a plurality of metal posts so as to avoid contamination of surfaces of the package structures by a solder material as in the prior art. Further, variation in the size of the metal posts is easy to control, thereby facilitating vertical stacking of the package structures and overcoming the conventional problem of joint deviation.

Furthermore, variation in the heights of the metal posts does not change the diameters of the metal posts and accordingly does not increase the surface area occupied by the metal posts, thereby avoiding reduction of available spaces for circuits and electronic elements.

Furthermore, the present invention avoids the risk of bridging when the metal posts are increased in height, thereby increasing the product yield.

Moreover, warpage of the substrates are prevented since the package structures are supported by the metal posts and the gap between the first and second package structures is filled with the encapsulant.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A package stack device, comprising:
a first package structure, comprising:
a first substrate having a first surface with a plurality of first metal posts and a second surface opposite to the first surface, and
a first electronic element disposed on the first surface of the first substrate and electrically connected to the first substrate;
a second package structure, comprising:
a second substrate having a third surface and a fourth surface opposite to the third surface, the fourth surface having a plurality of second metal posts connected to the first metal posts, respectively, so as to allow the second package structure to be stacked on the first package structure, and
a second electronic element disposed on the third surface of the second substrate and electrically connected to the second substrate; and
an encapsulant fully formed between the first surface of the first substrate and the fourth surface of the second substrate for encapsulating the first electronic element.

2. The device of claim 1, wherein the first metal posts are copper posts, respectively.

3. The device of claim 1, wherein the second metal posts are copper posts, respectively.

4. The device of claim 1, wherein end surfaces of the first metal posts are in width greater than, equal to or less than end surfaces of the second metal posts.

5. The device of claim 1, wherein a solder material is filled between the first metal posts and the corresponding second metal posts.

6. The device of claim 1, wherein the second surface of the first substrate has a plurality of ball pads for solder balls to be mounted thereon.

7. The device of claim 1, wherein the first electronic element is an active component and/or a passive component.

8. The device of claim 1, wherein the second electronic element is an active component and/or a passive component.

* * * * *

UNITED STATES PATENT AND TRADEMARK OFFICE
Certificate

Patent No. 8,531,021 B2                                                                            Patented: September 10, 2013

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Chu-Chin Hu, Taoyuan (TW); Shih-Ping Hsu, Taoyuan (TW); Yi-Ju Chen, Taoyuan (TW); and Dyi-Chung Hu, Taoyuan (TW).

Signed and Sealed this Sixth Day of May 2014.

<div style="text-align:right">

THAO X. LE
*Supervisory Patent Examiner*
Art Unit 2892
Technology Center 2800

</div>